United States Patent [19]
McAdams et al.

[11] Patent Number: 5,978,254
[45] Date of Patent: Nov. 2, 1999

[54] SEMICONDUCTOR MEMORY STRUCTURE FOR IMPROVED CHARGE STORAGE

[75] Inventors: Hugh P. McAdams, McKinney; Jeffrey Koelling, Dallas, both of Tex.

[73] Assignee: Texas Instruments Incorporated, Dallas, Tex.

[21] Appl. No.: 09/027,029

[22] Filed: Feb. 20, 1998

Related U.S. Application Data

[62] Division of application No. 08/839,004, Apr. 23, 1997, Pat. No. 5,792,682.

[51] Int. Cl.⁶ ..................................................... G11C 11/24
[52] U.S. Cl. ...................................... 365/149; 365/230.06
[58] Field of Search .............................. 365/149, 230.06, 365/189.09; 252/302, 303, 304

[56] References Cited

U.S. PATENT DOCUMENTS

| | | | |
|---|---|---|---|
| 4,628,486 | 12/1986 | Sakui | 365/149 |
| 5,238,860 | 8/1993 | Sawada | 437/47 |
| 5,297,104 | 3/1994 | Nakashima | 365/230.06 |
| 5,363,338 | 11/1994 | Oh | 365/230.06 |
| 5,410,508 | 4/1995 | McLaury | 365/189.09 |

Primary Examiner—A. Zarabian
Attorney, Agent, or Firm—Robert N. Rountree; Larry J. Bassuk; Richard L. Donaldson

[57] ABSTRACT

A circuit is designed with a decoder circuit (10), responsive to a first input signal (81) having a first voltage range, for producing a first output signal. An output circuit (11), responsive to the first output signal, produces a second output signal (26) having a second voltage range. The second voltage range includes a voltage less than a least voltage of the first voltage range and a voltage greater than a greatest voltage of the first voltage range.

20 Claims, 5 Drawing Sheets

5,978,254

SEMICONDUCTOR MEMORY STRUCTURE FOR IMPROVED CHARGE STORAGE

This application is a division of Ser. No. 839,004 filed Apr. 23, 1997, now U.S. Pat. No. 5,792,682.

FIELD OF THE INVENTION

This invention relates to an integrated circuit and more particularly to an integrated circuit with a level translator.

BACKGROUND OF THE INVENTION

Present complementary metal oxide semiconductor (CMOS) dynamic random access memory (DRAM) circuits are frequently used for main memory in a variety of applications including desk top and portable computer systems. These dynamic random access memory circuits frequently utilize memory cells formed by a single access transistor and a storage capacitor for storing an electrical charge representing a datum. An increasing demand for greater cell density in dynamic random access memory circuits has been fulfilled by reducing the operating voltage and the feature sizes of both the access transistor and the storage capacitor. These reductions in operating voltage and feature sizes of the storage capacitor reduce total charge that may be stored in the memory cell. The reduction in access transistor feature sizes, however, decreases the access transistor threshold voltage and increases subthreshold conduction. Moreover, this increase in subthreshold conduction increases the rate at which charge stored on the storage capacitor leaks through the access transistor.

Previous memory circuits have employed row decoders with level translators as disclosed in U.S. Pat. application Ser. No. 08/339,308, filed TI-16660B. The row decoder, disclosed in FIG. 7 of that application, uses a level translator to increase the word line voltage and avoid a threshold voltage loss at the storage capacitor due to the access transistor. Another embodiment disclosed in FIG. 8 uses a level translator in the word line drive circuit to accomplish a similar purpose. However, both embodiments drive the word line voltage to reference voltage $V_{SS}$ to turn off the access transistor. Thus, the rate of charge leakage from the storage capacitor may still be unacceptable due to the subthreshold characteristics of the access transistor.

SUMMARY OF THE INVENTION

These problems are resolved by a circuit comprising a decoder circuit, responsive to a first input signal having a first voltage range, for producing a first output signal. An output circuit, responsive to the first output signal, produces a second output signal having a second voltage range. The second voltage range includes a voltage less than a least voltage of the first voltage range and includes a voltage greater than a greatest voltage of the first voltage range.

The present invention provides high voltage level translation to avoid a threshold voltage loss at the storage capacitor due to the access transistor. Low voltage level translation reduces subthreshold leakage of charge from the storage capacitor through the access transistor.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
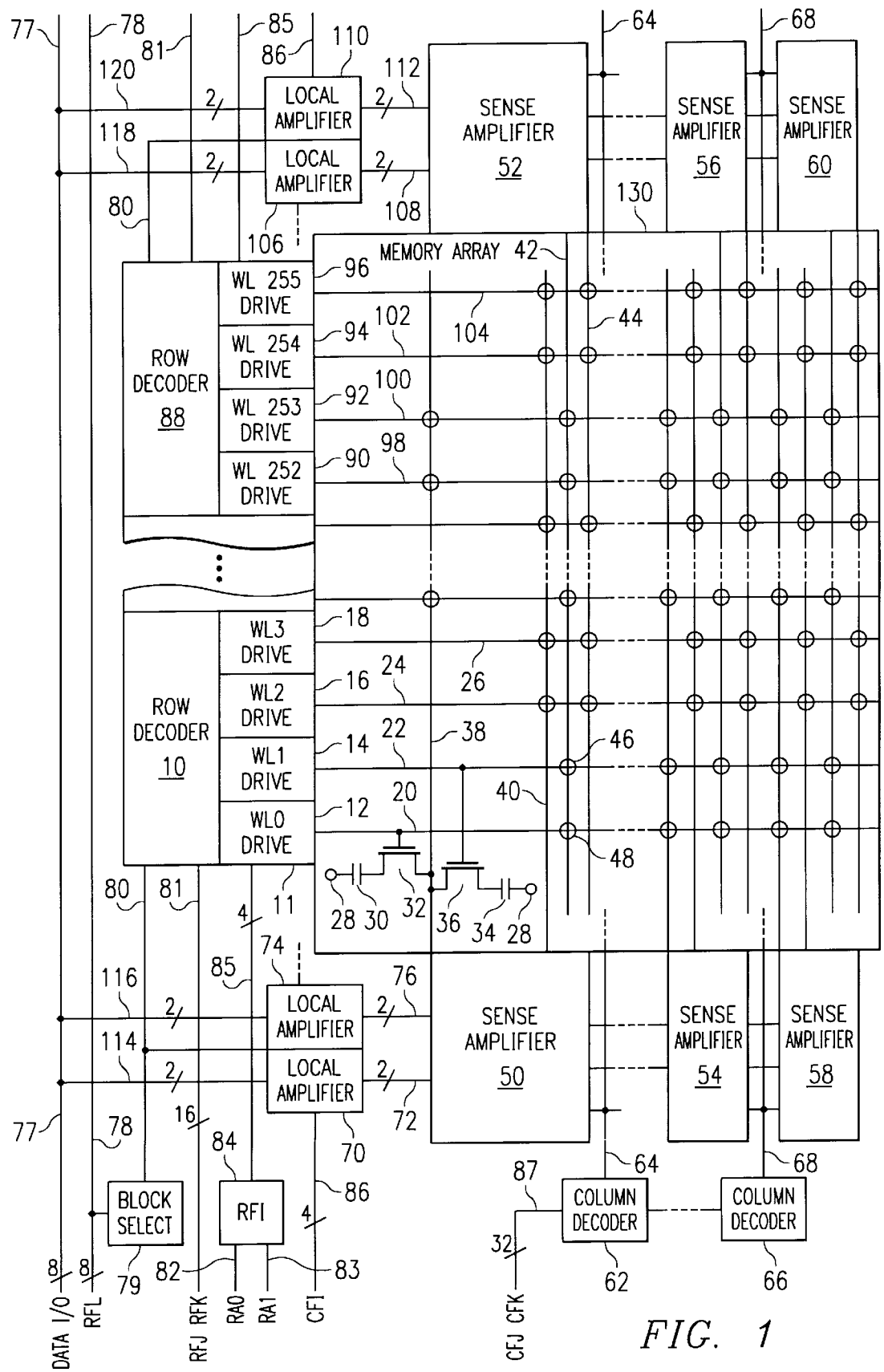
FIG. 1 is a block diagram of a memory device which may employ the row decoder of the present invention.

Referring now to FIG. 1, the dynamic random access memory device will be described in detail. Memory array 130 and related circuitry represent a basic block that may be partially replicated on a memory device to produce a desired memory size. For example, memory array 130 includes memory cells such as 46 and 48 organized in 256 rows and 1024 columns. Thus, memory array 130 would be repeated sixty-four times to produce a 16 megabit dynamic random access memory.

Each memory cell in memory array 130 includes, for example, a storage capacitor 30 and an access transistor 32 for selectively connecting the storage capacitor 30 to a bit line 38. A quantity of charge temporarily stored on storage capacitor 30 corresponds to a voltage that represents either a logical one or zero data state. The quantity of charge stored on storage capacitor 30, however, leaks away in time so that it is necessary to periodically refresh or restore the proper charge in the memory cell, thereby preserving the correct data state.

A memory cell in memory array 130 is addressed for reading or writing when block select circuit 79 produces block select signal $\overline{BS}$ on lead 80 in response to address signals RFL on bus 78. Block select signal $\overline{BS}$ enables row decoders represented by 10 and 88. Address signals RFJ and RFK on bus 81 select one of sixty-four row decoders represented by 10 and 88, for example row decoder 10. These address signals RFJ and RFK typically have a voltage range from reference voltage $V_{SS}$ to supply voltage $V_{DD}$ representing logical zero and logical one data states, respectively. The RFI factor generator 84 produces address signals RFI on bus 85 in response to address signals RA0 on lead 82 and RA1 on lead 83 for selecting one of four word line drive circuits. For example, consider that the word line drive circuit 12 in the output circuit 11 associated with the selected row decoder 10 is selected. Word line drive circuit 12 produces a high voltage on word line 20 that is positive with respect to supply voltage $V_{DD}$ by more than the threshold voltage of access transistor 32. This high voltage is sufficient to turn on all access transistors connected to word line 20 including access transistor 32, thereby coupling storage capacitor 30 to bit line 38. The charge on storage capacitor 30 is shared with bit line 38 to produce a voltage that is indicative of the data state of storage capacitor 30. This voltage on bit line 38 is either greater or less than the voltage on complementary bit line 40. Sense amplifier 50 amplifies the bit line difference voltage, thereby refreshing charge representing a datum stored on storage capacitor 30 of the memory cell. Other memory cells connected to word line 20 are simultaneously refreshed in a similar manner.

During a read operation, address signals CFJ and CFK on bus 87 select one of two hundred fifty-six column decoders, for example column decoder 62. Column decoder 62 produces a signal on column select lead 64 for coupling four sense amplifiers, including sense amplifier 50, to their respective local data buses 72, 76, 108 and 112. Address signals CFI on bus 86 select one of four local amplifiers, for example local amplifier 70, for coupling the datum from sense amplifier 50 to the data I/O bus 77 and, subsequently, to an output terminal (not shown).

During a write operation, a datum from an input terminal (not shown) is placed on data I/O bus 77. A control signal (not shown) causes local amplifier 70 to write the datum from data I/O bus 77 through local data bus 72 to sense amplifier 50. Sense amplifier 50 couples the new datum through bit line 38 and access transistor 32 to storage capacitor 30.

Finally, either the read or write operation is terminated when the selected row decoder 10 and word line drive circuit 12 drive the voltage on word line 20 to a voltage that is negative with respect to reference voltage $V_{SS}$. This negative voltage on word line 20 drives the channel region of access transistor 32 into a strongly accumulated state having a high density of majority carriers. This condition is highly advantageous compared to a word line that is only driven to reference voltage $V_{SS}$, because it reduces subthreshold conduction in access transistor 32, thereby minimizing charge leakage from storage capacitor 30 through access transistor 32.

Figure 2A:
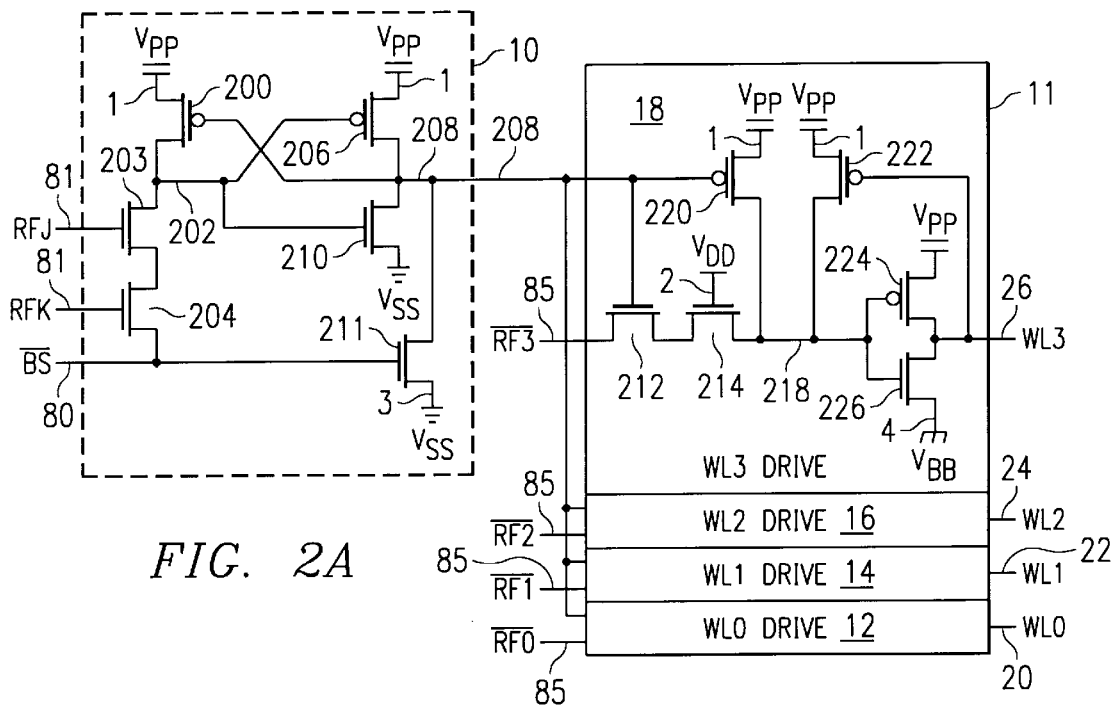
FIG. 2A is a schematic diagram of an embodiment of a row decoder and output circuit of the present invention.
Figure 2B:
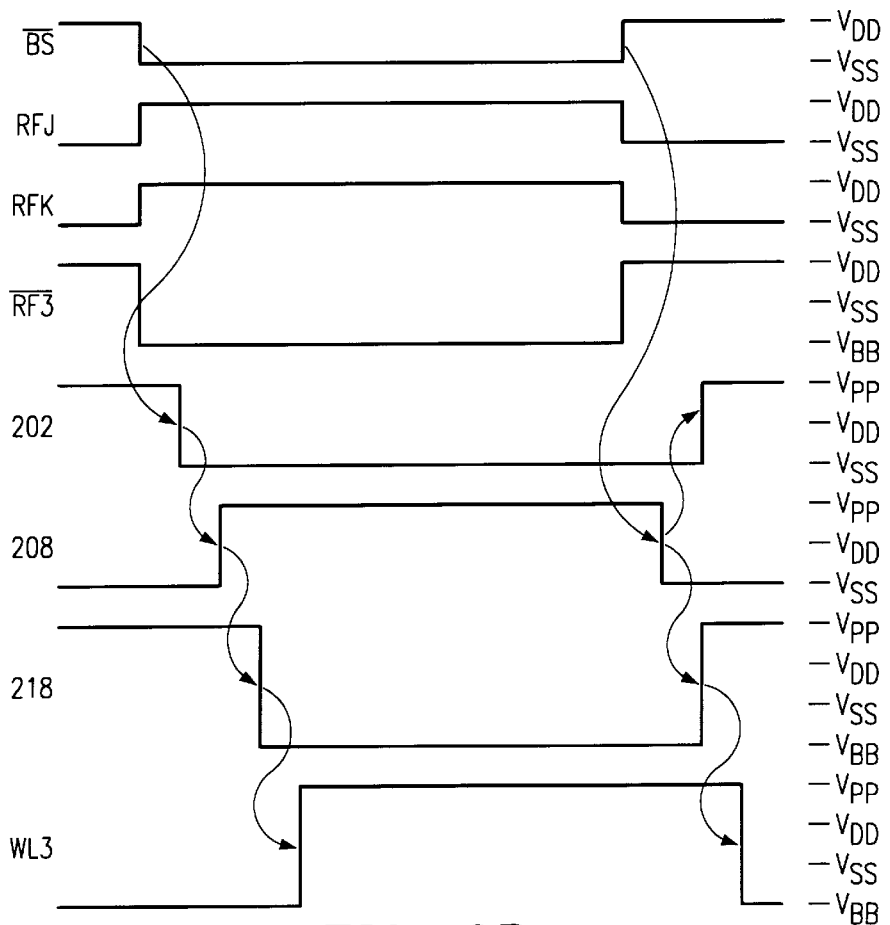
FIG. 2B is a timing diagram for the embodiment of FIG. 2A.

Referring now to FIG. 2A and 2B, a row decoder and output circuit that may be used in FIG. 1 will be described in detail. Row decoder 10 receives block select signal $\overline{BS}$ on lead 80. Block select signal $\overline{BS}$ is applied to the source of transistor 204 and the gate of transistor 211. Block select signal $\overline{BS}$ is high when row decoder 10 is disabled so that transistor 204 is off and transistor 211 is on. Thus, when row decoder 10 is disabled, transistor 211 holds the output terminal 208 to reference voltage $V_{SS}$. This low output signal at terminal 208 disables each word line drive circuit 12, 14, 16 and 18 in output circuit 11, thereby holding each word line WL0, WL1, WL2 and WL3 low.

Row decoder 10 is enabled when block select signal $\overline{BS}$ goes low so that transistor 211 is off. Address signals RFJ and RFK are unique to row decoder 10. At least one of address signals RFJ or RFK is low when row decoder 10 is not selected so that terminal 202 remains high and the output signal at terminal 208 is held low by transistor 210. When both of address signals RFJ and RFK go high, however, row decoder 10 is selected. Transistors 203 and 204 are much more conductive than transistor 200 and drive terminal 202 low. This low voltage at terminal 202 turns off transistor 210 and turns on transistor 206, thereby connecting output terminal 208 to high voltage supply $V_{PP}$. When the voltage at terminal 208 is within a P-channel threshold voltage of high voltage supply $V_{PP}$, transistor 200 turns off, thereby eliminating the current through transistors 200, 203 and 204. The high voltage at output terminal 208 enables output circuit 11.

Each word line drive circuit 12, 14, 16 and 18 is the same, so only word line drive circuit 18 will be described in detail. The high voltage output signal at terminal 208 turns off transistor 220 and turns on transistor 212. Address signal $\overline{RF3}$ remains high if word line drive circuit 18 is not selected. Transistor 214 remains off in this condition. Terminal 218 is held high by the latch formed by transistors 222, 224 and 226. Thus, word line WL3 remains low.

Word line drive circuit 18 is selected when address signal $\overline{RF3}$ at bus 85 is driven to a low voltage supply $V_{BB}$. Transistors 212 and 214 are much more conductive than transistor 222 and drive terminal 218 to low voltage supply $V_{BB}$. This low voltage at terminal 218 turns off transistor 226 and turns on transistor 224, thereby driving word line WL3 to high voltage supply $V_{PP}$. When the voltage at word line WL3 is within a P-channel threshold voltage ($V_{TP}$) of high voltage supply $V_{PP}$, transistor 222 turns off, thereby eliminating the current through transistors 222, 212 and 214. Thus, the voltage on word line WL3 reaches the level of high voltage supply $V_{PP}$ and turns on all access transistors connected to terminal 26. This high voltage on word line WL3 is highly advantageous because it permits a voltage equal to supply voltage $V_{DD}$ to be coupled to a storage capacitor 30 (FIG. 1) without the loss of a threshold voltage, thereby storing a maximum initial charge.

Word line WL3 (FIG. 2A) is driven low when block select signal $\overline{BS}$ goes high, thereby disabling row decoder 10 and driving output terminal 208 low. The output signal at terminal 208 turns off transistor 212 and turns on transistor 220, thereby driving terminal 218 to high voltage supply level $V_{PP}$. Transistor 224 is turned off and transistor 226 couples word line WL3 to low voltage supply $V_{BB}$ in response to the high voltage at terminal 218. The low voltage at word line WL3 turns on transistor 222, thereby latching terminal 218 to the high voltage supply level $V_{PP}$. This low voltage on word line WL3 is highly advantageous because it reduces subthreshold conduction in access transistor 32 (FIG. 1), thereby reducing the leakage of charge from storage capacitor 30.

Alternatively, word line WL3 (FIG. 2A) may be driven low when address signal $\overline{RF3}$ at bus 85 is driven high. As the voltage of address signal $\overline{RF3}$ at bus 85 approaches supply voltage $V_{DD}$, transistor 214 turns off due to a decrease in gate to source voltage. Transistors 224 and 226 have respective width to length ratios such that an N-channel threshold voltage ($V_{TN}$) below supply voltage $V_{DD}$ at terminal 218 is sufficient to drive word line WL3 low. The low voltage at word line WL3 turns on transistor 222, thereby driving terminal 218 to the high voltage supply level $V_{PP}$ and word line WL3 to low voltage supply level $V_{BB}$.

Figure 3:
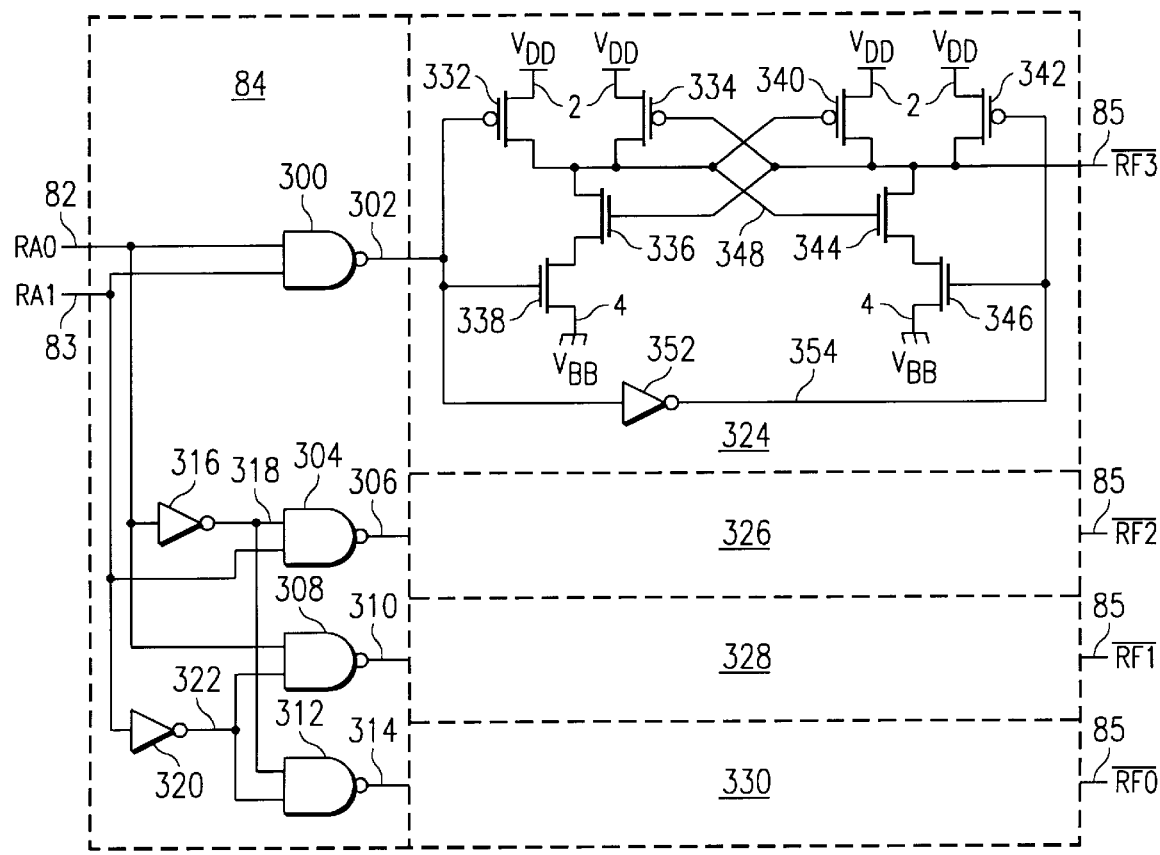
FIG. 3 is a schematic diagram of a row factor generator that may be used with the output circuit of FIG. 2A.

Referring now to FIG. 3, an RFI generator that may be used in the memory device of FIG. 1 will be described in detail. Inverters 316 and 320 invert address signals RA0 and RA1, respectively. RA0 and RA1 and their complements at terminals 318 and 322, respectively, are logically connected to NAND gates 300, 304, 308 and 312 to produce decoded output signals at terminals 302, 306, 310 and 314, respectively. The output signal at terminal 302, for example, is a complement of the logical AND of address signals RA0 and RA1.

Each output signal at terminals 302, 306, 310 and 314 is connected to a respective level translator. Each level translator circuit 324, 326, 328 and 330 is the same, so only level translator circuit 324 will be described in detail. The output signal at terminal 302 is connected to one input of a first NAND gate formed by transistors 332, 334, 336 and 338. Inverter 352 provides a complement of the output signal at terminal 302 to an input of a second NAND gate formed by transistors 340, 342, 344 and 346. The outputs of each NAND gate are cross coupled to a second input of the other NAND gate at terminal 348 and bus 85, respectively. Both NAND gates are connected between low voltage supply $V_{BB}$ and supply voltage $V_{DD}$.

When the output signal at terminal 302 is low, the output of the first NAND gate at terminal 348 is high. The output of inverter 352 at terminal 354 is also high, so the output of the second NAND gate, address signal $\overline{RF3}$ at bus 85, is coupled to low voltage supply $V_{BB}$ by transistors 344 and 346, thereby selecting a word line drive circuit. When the output signal at terminal 302 goes high, the output of inverter 352 at terminal 354 goes low and the output of the second NAND gate, address signal $\overline{RF3}$ at bus 85, goes high. With both input terminals of the first NAND gate high, the output at terminal 348 is coupled to low voltage supply $V_{BB}$ by transistors 336 and 338.

Figure 4:
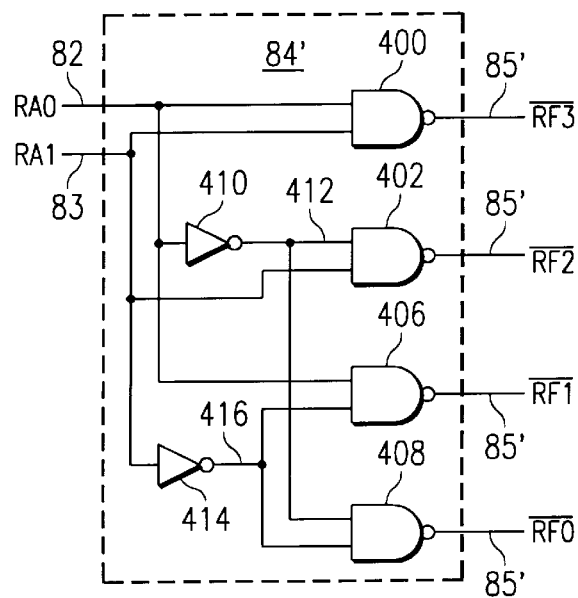
FIG. 4 is a logic diagram of another row factor generator.

Referring now to FIG. 4, a simplified RFI generator 84' that does not require a level translator may be used with another embodiment of the row decoder and output circuit. The function of RFI generator 84' is exactly the same as that of RFI generator 84 (FIG. 3) except that output signals 302, 306, 310 and 314 are connected directly to bus 85' to provide address signals $\overline{RF3}$, $\overline{RF2}$, $\overline{RF1}$ and $\overline{RF0}$, respectively. The simplified RFI generator is highly advantageous because it permits the capacitive load at bus 85' to be driven directly to reference supply $V_{SS}$ rather than to the relatively less efficient low voltage supply $V_{BB}$.

Figure 5A:
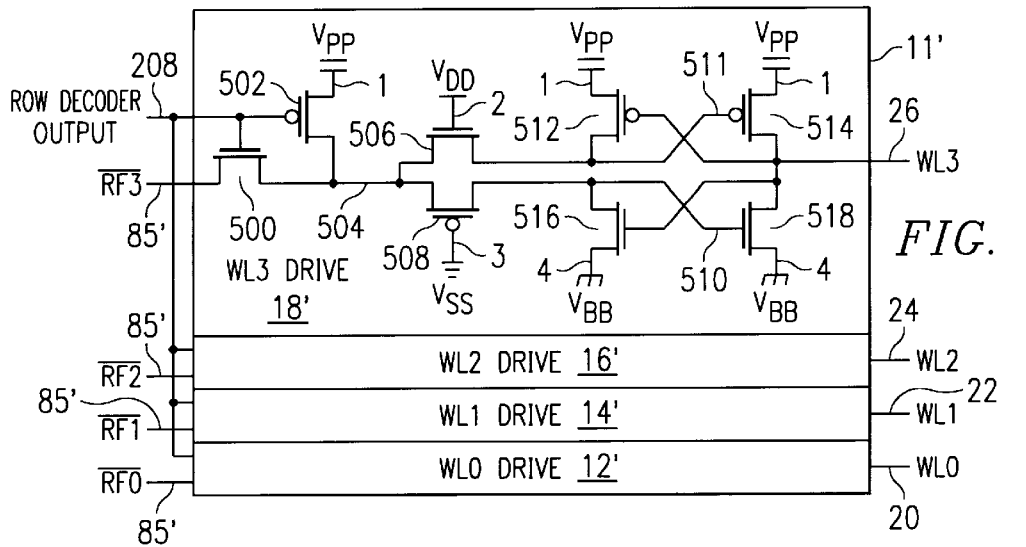
FIG. 5A is a schematic diagram of an embodiment of an output circuit that may be used with the row factor generator of FIG. 4.
Figure 5B:
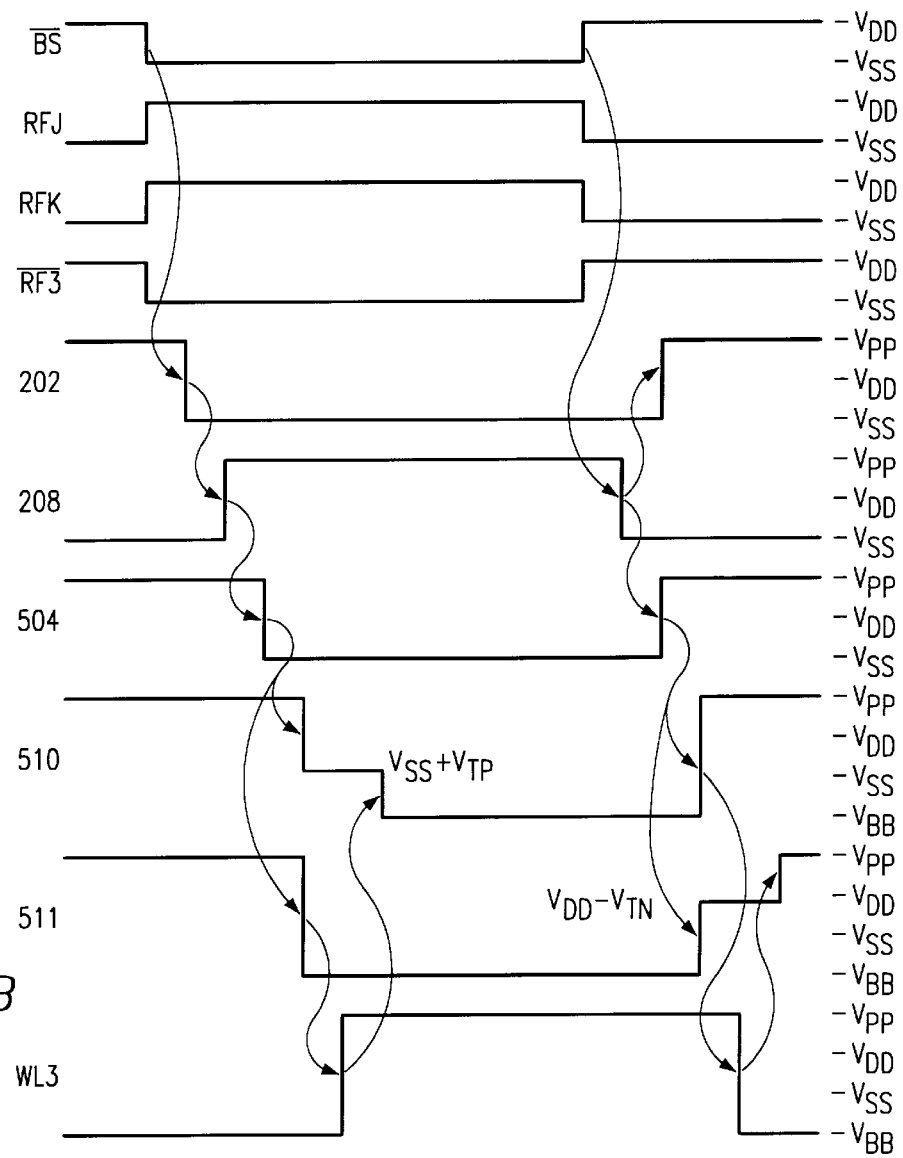
FIG. 5B is a timing diagram for the embodiment of FIG. 5A.

Referring now to FIG. 5A and 5B, an output circuit that may be used with RFI generator 84' (FIG. 4) will be described in detail. Each word line drive circuit 12', 14', 16' and 18' are the same, so only word line drive circuit 18' will be described in detail. When the row decoder output signal at lead 208 is low, transistor 500 is off and transistor 502 is on, thereby coupling terminal 504 to high voltage supply $V_{PP}$. Thus, transistor 506 is off and transistor 508 is on. Transistor 508 couples a positive voltage to the gate of transistor 518, thereby coupling word line WL3 to low voltage supply $V_{BB}$. The low voltage level at word line WL3 keeps transistor 516 off.

Output circuit 11' is enabled when the row decoder output signal at lead 208 goes high. Transistor 502 turns off and transistor 500 turns on. If word line drive circuit 18' is not selected, address signal $\overline{RF3}$ remains high and transistor 506 remains off. Terminal 511 remains latched high by transistor 512 whose gate is connected to WL3. Thus, WL3 remains at the level of low voltage supply $V_{BB}$ if word line drive circuit 18' is either disabled or not selected. This low voltage on word line WL3 is highly advantageous because it reduces subthreshold conduction in access transistor 32 (FIG. 1), thereby reducing the leakage of charge from storage capacitor 30.

When output circuit 11' (FIG. 5A) is enabled and word line drive circuit 18' is selected, address signal $\overline{RF3}$ goes low. Transistors 506 and 500 become much more conductive than transistor 512 and discharge terminal 511, thereby turning on transistor 514 and driving word line WL3 positive. At the same time, terminal 510 is partially discharged ($V_{SS}+V_{TP}$) through transistors 508 and 500, thereby reducing the conductivity of transistor 518. As word line WL3 becomes more positive than an N-channel threshold voltage above low voltage supply $V_{BB}$, transistor 516 turns on and couples terminal 510 to low voltage supply $V_{BB}$, thereby turning off transistor 518. When the voltage on word line WL3 is within a P-channel threshold voltage ($V_{TP}$) of high voltage supply $V_{PP}$, transistor 512 turns off, thereby eliminating the current path through transistors 512, 506 and 500.

The voltage on word line WL3 increases to the level of high voltage supply $V_{PP}$, thereby turning on all access transistors connected to word line WL3. This row decoder 10 and output circuit 11' is highly advantageous, because the high voltage on word line WL3 is generated by local level translation, thereby limiting the voltage range of address signals RFJ, RFK and $\overline{RF3}$ between supply voltage $V_{DD}$ and reference voltage $V_{SS}$. This limited voltage range conserves power consumed by charging and discharging the parasitic capacitance of buses 81 and 85'.

Word line drive circuit 18' is disabled when the row decoder output signal at terminal 208 goes low turning off transistor 500 and turning on transistor 502. Transistor 502 couples terminal 504 to high voltage supply $V_{PP}$. Transistor 506 applies a positive voltage to terminal 511 ($V_{DD}-V_{TN}$), thereby decreasing the conductivity of transistor 514. At the same time, transistor 508 applies high voltage supply $V_{PP}$ to terminal 510, thereby turning on transistor 518 and discharging word line WL3. As the voltage on word line WL3 decreases, transistor 512 turns on and applies high voltage supply $V_{PP}$ to the gate of transistor 514. When the voltage on word line WL3 decreases to an N-channel threshold voltage ($V_{TN}$) above low voltage supply $V_{BB}$, transistor 516 turns off, thereby eliminating the current path through transistors 516 and 508. Thus, the advantage of a voltage range on word line WL3 from low voltage supply $V_{BB}$ to high voltage supply $V_{PP}$ is achieved by local level translation of address signals RFI, RFJ and RFK, having a voltage range from reference supply $V_{SS}$ to supply voltage $V_{DD}$.

Row decoder 10 and output circuit 11' may utilize the instant invention with a conventional complementary metal oxide semiconductor (CMOS) process. Low voltage supply $V_{BB}$ at terminal 4 must adequately contact P-type bulk regions as well as N+ source regions of peripheral transistors to minimize potential differences during voltage transitions. Otherwise, such potential differences might forward bias an N+ diffused region, such as the source of transistor 518, with respect to its bulk terminal, thereby injecting minority carriers into the bulk or substrate. This is accomplished by forming ohmic contacts between low voltage supply $V_{BB}$ at terminal 4, P+ bulk contacts and N+ source regions as is well known by those having ordinary skill in the art.

Figure 6:
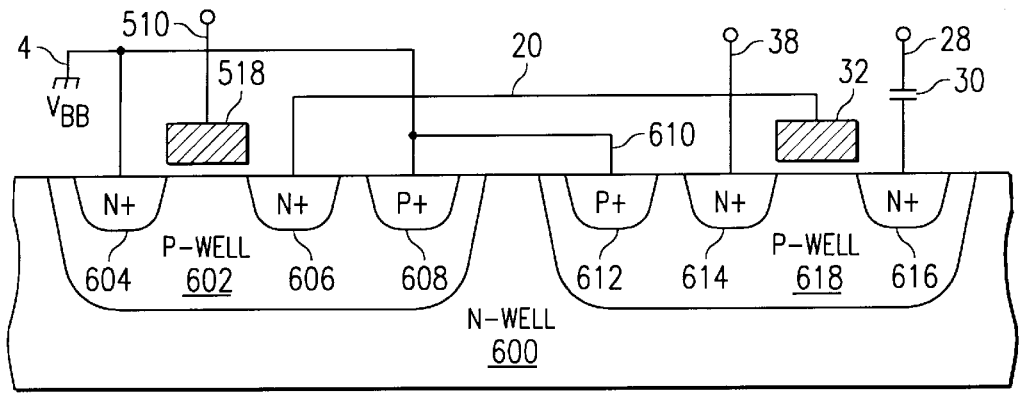
FIG. 6 is a diagram of a cross section of an embodiment of a part of an output circuit and a memory cell.
Figure 7:
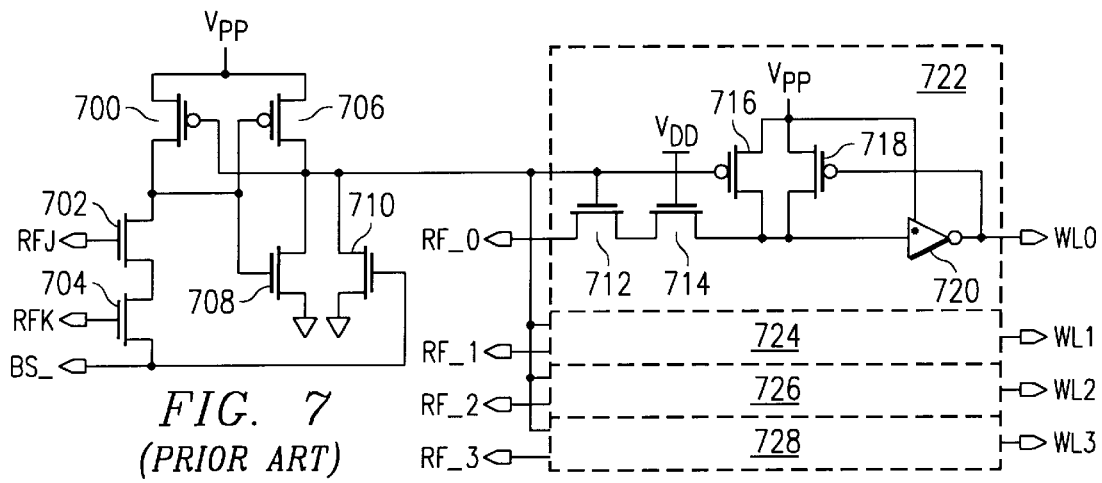
FIG. 7 is a schematic diagram of a row decoder and output circuit of the prior art.
Figure 8:
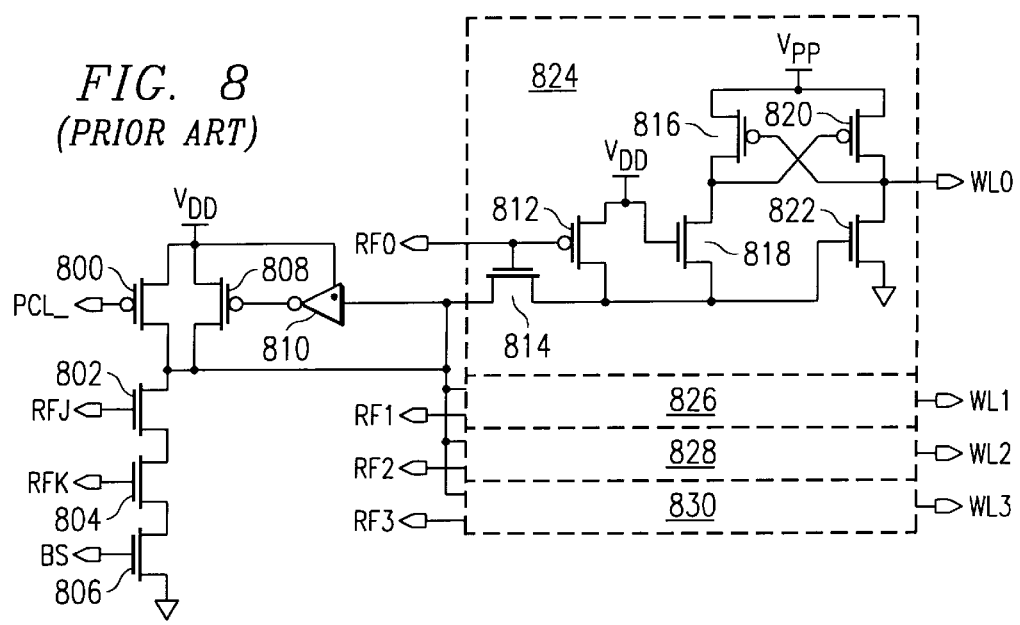
FIG. 8 is a schematic diagram of another embodiment of a row decoder and output circuit of the prior art.

Referring now to FIG. 6, there is a partial cross section of the memory device of FIG. 1 showing access transistor 32, storage capacitor 30 and transistor 518 (FIG. 5A) as they are constructed in a triple well CMOS process. Each N-channel transistor of row decoder 10 and output circuit 11', for example transistor 518, are placed in P-well 602. Memory array access transistors, for example 32, are placed in a separate P-well 618. Both P-wells are placed within N-well 600 to provide junction isolation between the P-wells 602 and 618. P-well 602 is contacted by P+ region 608. P-well 618 is contacted by P+ region 612. Ohmic contacts are formed coupling lead 610 to each of P+ regions 608 and 612 and to low voltage supply $V_{BB}$.

When an enabled and selected word line, for example word line WL2, is disabled and coupled to low voltage supply $V_{BB}$, the voltage at P-well 602 adjacent transistor 518 may rise slightly due to displacement current. Since source and drain regions 604 and 606, respectively, remain at low voltage supply $V_{BB}$, they may approach a forward bias condition with respect to P-well 602. This may result in some injection of minority carriers into P-well 602. The minority carriers, however, cannot migrate to the separate P-well 618 and recombine with charge at storage node 616. Thus, an additional advantage of the instant invention in combination with a triple well process is that minority carriers generated in the periphery may be effectively isolated from memory cells in the array.

Although the invention has been described in detail with reference to its preferred embodiment, it is to be understood that this description is by way of example only and is not to be construed in a limiting sense. For example, the level translator in row decoder 10 (FIG. 2A) might be eliminated by connecting the source of transistor 502 (FIG. 5A) to supply voltage $V_{DD}$. A conventional row decoder, having an output signal voltage range from reference supply $V_{SS}$ to supply voltage $V_{DD}$, might then be substituted for row decoder 10.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A structure for storing charge in a memory cell, comprising:
   a first lightly doped region formed at a face of a semiconductor body, the semiconductor body having a first conductivity type;
   a second lightly doped region formed at the face of the semiconductor body, the second lightly doped region having a second conductivity type;
   a third lightly doped region formed at the face of the semiconductor body within the second lightly doped region, the third lightly doped region spaced apart from the first lightly doped region, the third lightly doped region having the first conductivity type;
   a first transistor formed within the third lightly doped region, the first transistor having a current path and a gate;
   a storage capacitor for storing a voltage having a first voltage range; and
   a second transistor formed within the first lightly doped region, the second transistor having a current path and a gate, the current path of the second transistor coupled to the storage capacitor, the gate of the second transistor coupled to the current path of the first transistor, the gate of the second transistor coupled to receive a signal having a second voltage range, the second voltage range including a voltage greater than a greatest voltage of the first voltage range and including a voltage less than a least voltage of the first voltage range.

2. A structure as in claim 1, wherein the current path of the first transistor is coupled to the third lightly doped region.

3. A structure as in claim 1, wherein the first lightly doped region is coupled to receive a voltage less than the least voltage of the first voltage range.

4. A structure as in claim 1, wherein the second lightly doped region is coupled to receive a voltage of the first voltage range.

5. A structure as in claim 1, wherein the first lightly doped region is within the second lightly doped region.

6. A structure as in claim 1, wherein the first lightly doped region is coupled to the third lightly doped region.

7. A structure as in claim 1, wherein the first conductivity type is P-type and the second conductivity type is N-type.

8. A structure for storing charge in a memory cell, comprising:
   a first lightly doped region formed at the face of a semiconductor body, the first lightly doped region having a first conductivity type;
   a second lightly doped region formed at the face of the semiconductor body within the first lightly doped region, the second lightly doped region and the semiconductor body having a second conductivity type;
   a first transistor formed within the second lightly doped region, the first transistor having a current path and a gate;
   a storage capacitor for storing a voltage within a first voltage range; and
   a second transistor having a current path and a gate, the current path of the second transistor coupled to the storage capacitor, the gate of the second transistor coupled to the current path of the first transistor, the gate of the second transistor coupled to receive a signal within a second voltage range, the second voltage range including a voltage greater than a greatest voltage of the first voltage range and including a voltage less than a least voltage of the first voltage range.

9. A structure as in claim 8, wherein a first terminal of the current path of the of the first transistor is coupled to the second lightly doped region.

10. A structure as in claim 9, wherein the first terminal of the of the first transistor is coupled to a voltage supply terminal having the voltage less than a least voltage of the first voltage range.

11. A structure as in claim 10, wherein the second transistor is formed at the face of the semiconductor body without the first lightly doped region.

12. A structure as in claim 11, wherein the semiconductor body is coupled to the second lightly doped region.

13. A structure as in claim 11, wherein the first lightly doped region is coupled to a voltage supply terminal having a voltage included in the first voltage range.

14. A structure as in claim 13, wherein the first conductivity type is N-type and the second conductivity type is P-type.

15. A structure as in claim 11, further comprising a third transistor having a current path and a gate, a first terminal of the current path of the third transistor coupled to a voltage supply terminal having the voltage greater than the greatest voltage of the first voltage range, a second terminal of the current path of the third transistor coupled to the second terminal of the current path of the first transistor, and the gate of the third transistor coupled to the gate of the first transistor.

16. A structure as in claim 15, further comprising a third lightly doped region having the first conductivity type, the third transistor formed at the face of the semiconductor body within the third lightly doped region, the first terminal of the third transistor coupled to the third lightly doped region.

17. A structure as in claim 9, wherein the first lightly doped region is coupled to a voltage supply terminal having a voltage included in the first voltage range.

18. A structure as in claim 17, further comprising a third transistor having a current path and a gate, a first terminal of the current path of the third transistor coupled to a voltage supply terminal having the voltage less than the least voltage of the first voltage range, a second terminal of the current path of the third transistor coupled to the second terminal of the current path of the first transistor, and the gate of the third transistor coupled to the gate of the first transistor.

19. A structure as in claim 18, further comprising a third lightly doped region having the first conductivity type, the third transistor formed at the face of the semiconductor body within the third lightly doped region, the first terminal of the third transistor coupled to the third lightly doped region.

20. A structure as in claim 19, wherein the first conductivity type is P-type and the second conductivity type is N-type.

* * * * *